United States Patent
Siefering et al.

(10) Patent No.: US 9,911,631 B2
(45) Date of Patent: Mar. 6, 2018

(54) PROCESSING SYSTEM AND METHOD FOR PROVIDING A HEATED ETCHING SOLUTION

(71) Applicant: TEL FSI, Inc., Chaska, MN (US)

(72) Inventors: Kevin L Siefering, Excelsior, MN (US); William P Inhofer, Plymouth, MN (US)

(73) Assignee: TEL FSI, INC., Chaska, MN (US)

( * ) Notice: Subject to any disclaimer, the term of this patent is extended or adjusted under 35 U.S.C. 154(b) by 0 days.

(21) Appl. No.: 14/209,805

(22) Filed: Mar. 13, 2014

(65) Prior Publication Data
US 2014/0264153 A1   Sep. 18, 2014

Related U.S. Application Data

(60) Provisional application No. 61/801,072, filed on Mar. 15, 2013, provisional application No. 61/924,838,
(Continued)

(51) Int. Cl.
*H01L 21/302* (2006.01)
*H01L 21/461* (2006.01)
(Continued)

(52) U.S. Cl.
CPC ...... *H01L 21/67075* (2013.01); *G05B 19/418* (2013.01); *H01L 21/02019* (2013.01);
(Continued)

(58) Field of Classification Search
None
See application file for complete search history.

(56) References Cited

U.S. PATENT DOCUMENTS 5,158,100 A    10/1992  Tanaka et al.
5,470,421 A *  11/1995  Nakada et al. ............ 438/757
(Continued)

FOREIGN PATENT DOCUMENTS

CN    101215100 A    7/2008
CN    101234853 A    8/2008
(Continued)

OTHER PUBLICATIONS

United States Patent and Trademark Office, International Search Report and Written Opinion for corresponding International Application No. PCT/US14/26432, dated Jul. 18, 2014, 16 pages.
(Continued)

*Primary Examiner* — Stephanie Duclair
(74) *Attorney, Agent, or Firm* — Kagan Binder, PLLC

(57) ABSTRACT

Embodiments of the invention provide a processing system and a method for processing with a heated etching solution. In one example, tight control over temperature and hydration level of an acidic etching solution is provided. According to one embodiment, the method includes forming the heated etching solution in a first circulation loop, providing the heated etching solution in the process chamber for treating a substrate, forming an additional heated etching solution in a second circulation loop, and supplying the additional heated etching solution to the first circulation loop. According to one embodiment, the processing system includes a process chamber for treating the substrate with the heated etching solution, a first circulation loop for providing the heated etching solution into the process chamber, and a second circulation loop for forming an additional heated etching solution and supplying the additional heated etching solution to the first circulation loop.

20 Claims, 2 Drawing Sheets

Related U.S. Application Data filed on Jan. 8, 2014, provisional application No. 61/924,847, filed on Jan. 8, 2014, provisional application No. 61/928,894, filed on Jan. 17, 2014.

(51) Int. Cl.

| | |
|---|---|
| *C03C 15/00* | (2006.01) |
| *C03C 25/68* | (2006.01) |
| *H01L 21/67* | (2006.01) |
| *H01L 21/3213* | (2006.01) |
| *H01L 21/48* | (2006.01) |
| *H01L 21/02* | (2006.01) |
| *H01L 21/306* | (2006.01) |
| *G05B 19/418* | (2006.01) |
| *H01L 21/311* | (2006.01) |

(52) U.S. Cl.
CPC .. *H01L 21/30608* (2013.01); *H01L 21/31111* (2013.01); *H01L 21/32134* (2013.01); *H01L 21/4835* (2013.01); *H01L 21/6708* (2013.01); *H01L 21/67017* (2013.01)

(56) References Cited

U.S. PATENT DOCUMENTS

| | | | |
|---|---|---|---|
| 6,001,215 A * | 12/1999 | Ban | H01L 21/67086 156/345.15 |
| 2002/0007803 A1 | 1/2002 | Chiu | |
| 2002/0019128 A1 | 2/2002 | Lee et al. | |
| 2002/0072235 A1 | 6/2002 | Haga et al. | |
| 2002/0102851 A1 | 8/2002 | Yokomizo et al. | |
| 2003/0056577 A1 | 3/2003 | Ottow et al. | |
| 2003/0181040 A1 | 9/2003 | Ivanov et al. | |
| 2004/0157452 A1 | 8/2004 | Ogawa et al. | |
| 2004/0200806 A1 | 10/2004 | Izuta et al. | |
| 2005/0230045 A1 | 10/2005 | Okuchi et al. | |
| 2006/0151112 A1 | 7/2006 | Yoshida et al. | |
| 2008/0087645 A1* | 4/2008 | Izuta | C09K 13/04 216/93 |
| 2009/0236316 A1 | 9/2009 | Itou et al. | |
| 2010/0210110 A1 | 8/2010 | Okuchi et al. | |
| 2011/0056913 A1 | 3/2011 | Mayer et al. | |
| 2012/0006790 A1 | 1/2012 | Komori et al. | |
| 2012/0067847 A1 | 3/2012 | Sakurai et al. | |
| 2012/0247505 A1 | 10/2012 | Brown et al. | |
| 2014/0277682 A1 | 9/2014 | Siefering et al. | |

FOREIGN PATENT DOCUMENTS

| | | |
|---|---|---|
| JP | 7-230981 A | 8/1995 |
| TW | 511180 B | 11/2002 |
| TW | 1233157 B | 5/2005 |
| TW | 201102352 A | 1/2011 |

OTHER PUBLICATIONS

Notification of Examination Opinions and translation of Notification of Examination Opinions, TW Patent Application No. 103109721, dated Oct. 6, 2015, pp. 1-13.
Notification of Examination Opinions and translation of Notification of Examination Opinions, TW Patent Application No. 103109718, dated Oct. 16, 2015, pp. 1-19.
Second Notification of Examination Opinions and translation of Notification of Examination Opinions, TW Patent Application No. 103109718, dated Aug. 22, 2016, pp. 1-4.
United States Patent and Trademark Office, International Search Report and Written Opinion for corresponding International Application No. PCT/US14/26681, dated Jul. 14, 2014, 12 pages.
Translated Notification of First Office Action of SIPO, CN Patent Application No. 2014[7]80015977.9, dated Mar. 2, 2014, 1-13 pp.

* cited by examiner

PROCESSING SYSTEM AND METHOD FOR PROVIDING A HEATED ETCHING SOLUTION

CROSS-REFERENCE TO RELATED APPLICATIONS

Pursuant to 37 C.F.R. § 1.78(a)(4), this application claims the benefit of and priority to prior filed Provisional Application Ser. No. 61/801,072, filed Mar. 15, 2013; Provisional Application Ser. No. 61/924,838, filed Jan. 8, 2014; Provisional Application Ser. No. 61/924,847, filed Jan. 8, 2014; and Provisional Application Ser. No. 61/928,894, filed Jan. 17, 2014. The entire contents of these applications are expressly incorporated herein by reference.

FIELD OF INVENTION

The present invention relates to the field of providing a heated etching solution for treating a substrate, and more particularly to a processing system and method for improving temperature and hydration level control where refilling of the heated etching solution is required.

BACKGROUND OF THE INVENTION

In many single wafer or batch spray wafer processing systems, an etching solution is lost from the etching solution supply system due to dispensing of the etching solution onto the wafers or substrates in a process chamber. Therefore, refilling of the etching solution supply system is required in order to replace the etching solution. Even if the etching solution is drained from the process chamber and reclaimed by the etching solution supply system, some of the etching solution is lost and the reclaimed etching solution has different physical properties (e.g., temperature and water content) than the etching solution dispensed onto the wafers. A similar situation can occur in wet benches where an etching solution can be lost through drag-out during batch transfers or during either partial or full bath changes.

In order to perform etching processes with good repeatability over the etch rate and etch selectivity between different materials, tight control over the processing conditions is essential. In one example, this includes requirement for tight control over temperature and hydration level of an acidic etching solution in a substrate processing system.

SUMMARY OF THE INVENTION

Embodiments of the invention provide a processing system and a method for processing a substrate with a heated etching solution.

According to one embodiment the method includes forming the heated etching solution in a first circulation loop, providing the heated etching solution in the process chamber for treating the substrate, forming an additional heated etching solution in a second circulation loop, and supplying the additional heated etching solution to the first circulation loop. In one example, forming the additional heated etching solution includes introducing an additional etching solution into the second circulation loop, heating the additional heated etching solution to boiling, boiling off water from the additional heated etching solution until a preselected hydration level is reached, and circulating the additional heated etching solution in the second circulation loop.

According to one embodiment, the processing system includes a process chamber for treating the substrate with the heated etching solution, a first circulation loop for providing the heated etching solution into the process chamber, and a second circulation loop for forming an additional heated etching solution and supplying the additional heated etching solution to the first circulation loop.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
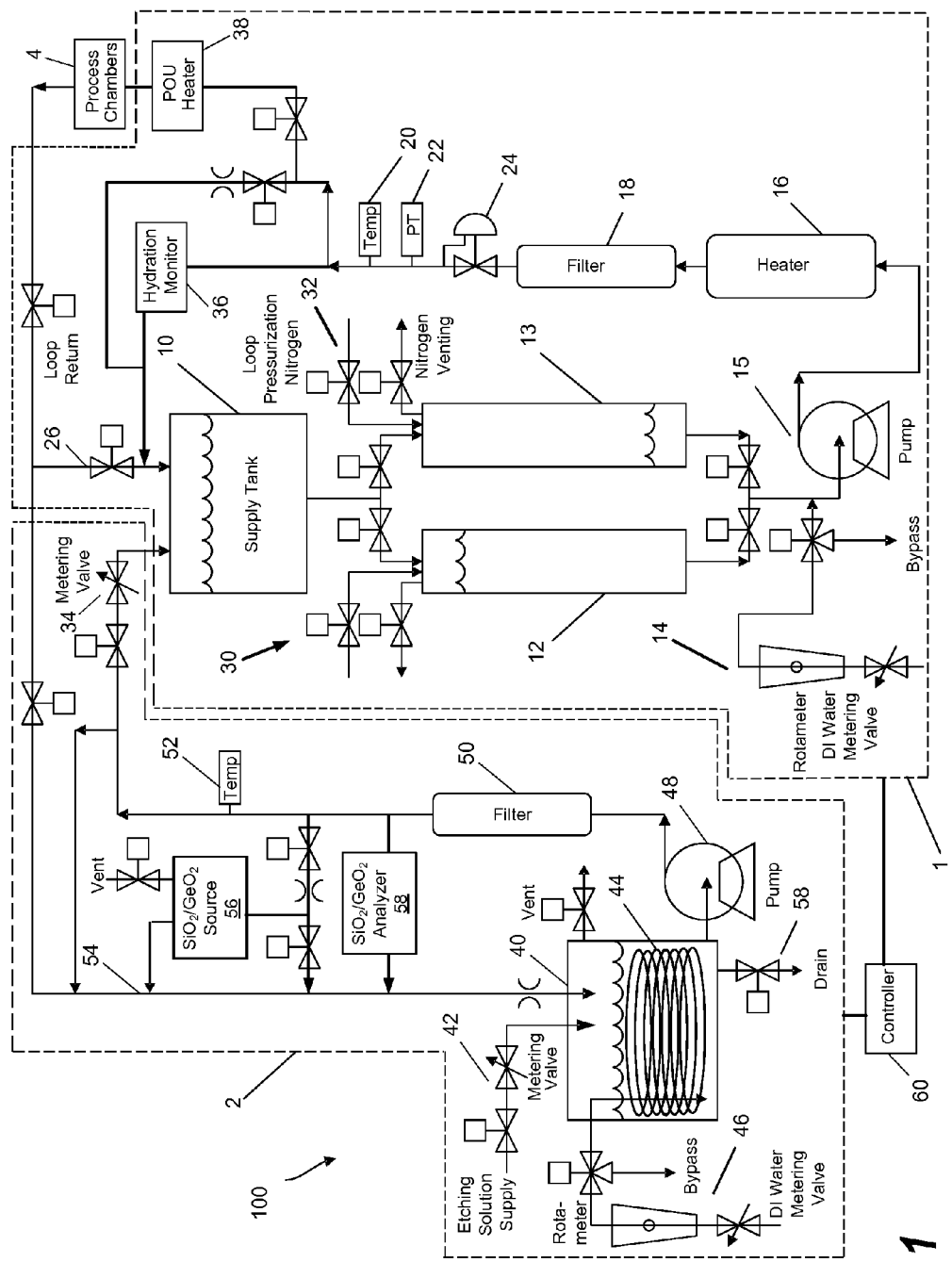
FIG. 1 schematically shows a processing system for treating a substrate with a heated etching solution according to an embodiment of the invention.

Embodiments of the invention relate to a processing system and method for improving temperature and hydration level control where refilling of a heated etching solution is required. According to some embodiments, a processing system and method are provided that allow for tight control over temperature and hydration level (water content) of an acidic etching solution in a substrate processing system.

In the manufacture of semiconductor devices, acidic etching solutions are often used for treating and etching wafers and substrates. One example includes the use of phosphoric acid etching solution, however other types of acids are also commonly used in manufacturing. Phosphoric acid ($H_3PO_4$) is typically supplied as a mixture with water, for example as an 85% phosphoric acid-15% water mixture. This is primarily done to reduce the viscosity of the phosphoric acid to a level that facilitates delivery of the etching solution in a manufacturing facility using conventional liquid chemical distribution systems.

The boiling point of the 85% phosphoric acid mixture is approximately 158° C. at atmospheric pressure, and when the mixture is heated and starts to boil, the vapor leaving the mixture is predominantly water. This drives up the concentration of phosphoric acid in the liquid phase through a simple distillation process. As the hydration level in the liquid is reduced, the boiling point of the mixture rises, and water may be boiled off until a desired hydration level is reached. This way, hydration level control can be used as a means for maintaining both the temperature and the hydration level at a predetermined level.

Once the temperature of the phosphoric acid mixture reaches the desired set point (e.g., 165° C.), the heater power can be maintained at a sufficiently high level to continue boiling the phosphoric acid mixture and liquid water can be added to the mixture to replace the water vapor that is lost through the boiling distillation. This may be done by turning on and off a slow flow rate of make-up water coming into the phosphoric acid circulation system, typically upstream of a heater in the circulation system. The control of this on/off of the water flow is based on the temperature of the mixture. If the temperature is too high, the water is turned on. If the temperature is too low, the water is turned off. Such simple on/off control is like a thermostat. More typically, a more complex proportional-integral-derivative (PID) algorithm is applied to the water on/off signal based on the measured temperature, setting up a duty cycle of on/off with a variable % output. Alternatively, a flow controller may be used to control a flow rate of the water.

Single substrate processing systems commonly having a plurality of process chambers (e.g., 8 or more process chambers) where each chamber processes one substrate at a time. The use of a plurality of process chambers maximizes throughput and it is critical to have a phosphoric acid supply system with a continuously available supply of phosphoric acid at the desired processing condition (e.g., composition and temperature) to treat the substrates. One problem that is encountered in single substrate processing systems is that phosphoric acid supply systems regularly dispense the heated etching solution to the process chambers by drawing from a circulation loop, so regular refills must be made to maintain the liquid level in the circulation loop. Refilling with fresh etching solution is problematic because the etching solution can come in not only cold, but also with hydration level that is too high. Thus, an injection of the fresh etching solution into the circulation loop not only causes a drop in temperature, but also an increase in hydration level of the etching solution. This incoming fresh etching solution mixes with heated etching solution in the circulation loop and flows through a heater in the circulation loop. Once through the heater, the mixture flows past a resistance temperature detector (RTD) where the temperature is measured and the drop in temperature is detected. The PID controller reacts by stopping the water injection, but this is too late, since the liquid is already past the heater. The disturbance in temperature is then seen at the process chamber dispense point. The heater continues to push in heat to supply the latent heat of vaporization and boiling off water in the system until the desired hydration level is reestablished. Some of the heated etching solution dispensed to the process chambers may be recycled and returned to the circulation loop but at a reduced temperature.

Embodiments of the invention provide a processing system and method for processing a substrate with a heated etching solution. The processing system includes a process chamber for treating the substrate with the heated etching solution, a first circulation loop for providing the heated etching solution into the process chamber, and a second circulation loop for forming an additional heated etching solution, and supplying the additional heated etching solution to the first circulation loop. The method includes forming the heated etching solution in a first circulation loop, providing the heated etching solution in a process chamber for treating the substrate, forming an additional heated etching solution in a second circulation loop, and supplying the additional heated etching solution to the first circulation loop.

According to one embodiment, a two-stage heating system containing first and second circulation loops is described, where the second circulation loop (second stage) heats up additional etching solution (e.g., phosphoric acid/water mixture) from room temperature to boiling and boils off water until the hydration level reaches a predetermined hydration level (control temperature), and subsequently the additional heated etching solution is introduced into a first circulation loop (first stage). The additional heated etching solution may be continuously circulated within the second circulation loop. An amount of the additional heated etching solution at the correct hydration level is then withdrawn from the second circulation loop in order to refill the first circulation loop, where further heating of the etching solution can take place. The two-stage heating system allows for tight temperature control in the first circulation loop and continuous availability of heated etching solution for processing substrates during and following a refill of the first circulation loop with additional heated etching solution from the second circulation loop. Although a heated etching solution containing a phosphoric acid-water mixture is described herein, those skilled in the art will readily realize that embodiments of the invention can also be applied to other etching solutions and acids.

FIG. 1 schematically shows a processing system 100 for treating substrates with a heated etching solution. The substrates can, for example, include wafers (e.g., Si) that are commonly used in semiconductor manufacturing. The processing system 100 includes a first circulation loop 1, a second circulation loop 2, and a plurality of process chambers 4. In one example, the plurality of process chambers 4 can include up to 8 process chambers. The first circulation loop 1 contains a first supply tank 10 with a heated etching solution, intermediate tanks 12 and 13, valves 30 and 32 for nitrogen pressurizing and nitrogen venting, and a DI water supply system 14 containing a deionized (DI) water source (not shown), a DI water metering valve, and a rotameter for measuring the flow of DI water. Although not shown in FIG. 1, the first supply tank 10 may further include a valve for exhausting water vapor. A pump 15 is provided for circulating the heated etching solution in the first circulation loop 1, an inline heater 16 is provided for supplying heat to the heated etching solution, a filter 18 is provided for filtering impurities and particles from the heated etching solution, a pressure regulator 24 and a pressure transducer 22 are provided for regulating the pressure of the heated etching solution, and a temperature probe (sensor) 20 is provided for measuring and monitoring the temperature of the heated etching solution. A loop return line 26 is configured for returning the heated etching solution to the first supply tank 10. In another example, the pump 15 may be omitted and the intermediated tanks pressurized with nitrogen case to circulate the heated etching solution. In still another example, the intermediate tanks 12 and 13, valves 30 and 32, may be omitted and the pump 15 used to circulate the heated etching solution.

The second circulation loop 2 contains a second supply tank 40 containing an immersion heater 44 for heating an additional etching solution, an etching solution supply 42 containing a etching solution source (not shown) and a metering valve, and a DI water supply system 46 containing a deionized (DI) water source (not shown), a DI water metering valve, and a rotameter for measuring the flow of DI water. The etching solution supply may be configured for providing a fresh etching solution. A pump 48 is provided for recirculating the additional heated etching solution in the second circulation loop 2, a filter 50 is provided for filtering impurities and particles from the additional heated etching solution, and temperature probe (sensor) 52 is provided for measuring and monitoring the temperature of the additional heated etching solution. A loop return line 54 is configured for returning the additional heated etching solution to the second supply tank 40. The second circulation loop 2 further includes a metering valve 34 for introducing fresh additional heated etching solution from the second circulation loop 2 to the first circulation loop 1. Although not shown, the second circulation loop 2 may further include a hydration monitor.

According to other embodiments, the second supply tank 40 can contain heated walls or an in-line heater may be included in the second circulation loop 2 downstream of the pump 48. The pump 48 is provided to circulate the additional heated etching solution and to provide pressure to drive the filling of the first supply tank 10 with the additional heated etching solution. Alternatively, the second supply tank 40 can be located at a height above the first supply tank 10 and the additional heated etching solution simply drained by gravity from the second supply tank 40 to the first supply tank 10.

The same type of water-based temperature/concentration control set-up and control algorithm may be used in the second circulation loop 2 as in the first circulation loop 1. The DI water supply system 46 can be used to add water based on the temperature of the additional heated etching solution. In this way, both the temperature and hydration level of the additional heated etching solution in the second circulation loop 2 may be controlled at the desired levels for the first circulation loop 1. Thus, when the additional heated etching solution is injected from the second circulation loop 2 into the first circulation loop 1, the change in both temperature and concentration of the heated etching solution can be very small and the temperature control algorithm in the first circulation loop 1 is easily able to maintain the temperature to within the desired tolerances. This allows for tight control over temperature and hydration level of the heated etching solution in the first circulation loop 1, even during addition of the additional heated etching solution from the second circulation loop 2 to the first circulation loop 1.

According to some embodiments, the heated etching solution may be used to etch silicon-containing materials on the substrates. The etch rate of silicon dioxide films in hot phosphoric acid is known to vary strongly with the concentration of dissolved silica ($SiO_2$) in the hot phosphoric acid solution, where the etch rate is reduced for high levels of dissolved silica. The etch rate of silicon nitride films varies much less with the same dissolved silica content. This can result in a strong variability of the selectivity of nitride etching to oxide etching defined as the ratio of the nitride to oxide etch. It can be advantageous to have a high etch selectivity of nitride over oxide, but it is also advantageous to have a very reproducible and stable selectivity, so that the oxide loss that occurs during etching of nitride films is reproducible over time and also from one processing system to the next processing system.

FIG. 1 further shows a $SiO_2$/$GeO_2$ source 56 and a $SiO_2$/$GeO_2$ analyzer 58. The $SiO_2$/$GeO_2$ source 56 can be $SiO_2$ source, a $GeO_2$ source or a $SiO_2$ and $GeO_2$ source. In one example, a $SiO_2$ source can include a tank or vessel either containing or constructed from silicon dioxide (e.g., quartz, high purity glass, silica gel or the like) or silicon nitride. A valve is provided to divert the additional heated etching solution in the second circulation loop 2 through an orifice (as needed to limit the flow rate) through the tank or vessel. The phosphoric acid in the additional heated etching solution etches the silicon dioxide or silicon nitride within the tank or vessel and flows into the second supply tank 40. As the phosphoric acid passes through the silicon dioxide or silicon nitride contained in the tank or vessel, it etches the material, picking up dissolved silica, so that by flowing through this tank or vessel, the silica content of the additional heated etching solution can be increased. When the flow is stopped through the tank or vessel, a drain valve can be opened and a vent valve opened simultaneously, allowing the additional heated etching solution within the tank or vessel to drain into the second supply tank 40.

The $SiO_2$/$GeO_2$ source 56 can be used with "open loop" control. For example, it can be set up with a timed operation such that the additional heated etching solution is diverted through the $SiO_2$ source on a fixed schedule, or it can be diverted through the $SiO_2$ source for a fixed amount of time every time the second supply tank 40 is refilled, thereby effectively adding the right amount of silica for the amount of additional etching solution that is added to the second circulation loop 2. Alternatively, the $SiO_2$/$GeO_2$ source 56 can be used be used with "closed loop" control. This requires the use of $SiO_2$/$GeO_2$ analyzer 58 that can detect the dissolved silica concentration in the additional heated etching solution. The operation of the $SiO_2$/$GeO_2$ source 56 can be coupled to the output from the $SiO_2$/$GeO_2$ analyzer 58 in various ways. For example, simple on/off control could be used, where the $SiO_2$ source is turned on whenever the silica level in the second circulation loop 2 is too low, and turned off when it is too high. Alternatively, the amount of silica that needs to be added to the second circulation loop 2 can be calculated based on the analyzer reading and the $SiO_2$ source can then be turned on for a duration that is calculated to add the proper amount of silica to the second circulation loop 2.

In the latest generations of semiconductor devices, the use of SiGe has become prevalent, and in some cases a SiGe film on a substrate is exposed to the etchant during silicon nitride etching. Because SiGe can be attacked by the phosphoric acid, particularly at high temperatures that are needed to successfully transition the nitride etch process to single wafer platforms, selectivity improvement of the etching of silicon nitride over SiGe can be critical.

While control of the dissolved silica has been widely understood to be important in suppressing undesired etching of silicon dioxide, it is not clear that simply controlling silica levels will suppress SiGe etching with the same efficiency. Control of the dissolved germanium dioxide type species concentration may significantly improve selectivity control of SiGe etching. The dissolved germanium dioxide concentration can be controlled in a fashion identical or similar to that described above for silica. A $GeO_2$ source (such as solid $GeO_2$, SiGe, or films of these materials on another substrate) could be used as a $GeO_2$ source, and recirculating flow of the additional heated etching solution can be directed through $GeO_2$ source in order to increase the dissolved germanium oxide concentration. When the desired concentration is reached, the circulating flow can be bypassed around the $GeO_2$ source so that addition is stopped. The $SiO_2$/$GeO_2$ analyzer 58 can monitor germanium oxide dissolved species concentration, preferably in addition to the dissolved silica species, and can be used to control the addition of germanium oxide and/or silica to maintain a relatively constant concentration, and thus a constant etch selectivity.

In order to reduce the cost of chemicals for some etching applications, it may be advantageous to "reclaim" the etching solution that drains from the process chambers 4 by processing it again through the first and/or second circulation loops, mixing it with additional heated etching solution, and passing it again to the first circulation loop 1 for reuse. FIG. 1 shows loop returns 26 and 54 configured from returning the dispensed heated etching solution to the first and second circulation loops, respectively. The dispensed heated etching solution may be drained from the process chambers 4 drain via gravity (or a lift pump if on the same level) back into the supply tanks 40 and 10. A drain valve 58 is shown on the second supply tank 40 (though it could be located anywhere in the second circulation loop 2). While a drain valve would be needed in any case for maintenance purposes, in a reclaim application, it would likely be necessary for "bleed and feed" type operation. Assuming that very little heated etching solution is lost in a reclaim process (e.g., left on the wafers or in the baffles to be rinsed to a waste drain system), a large majority of the heated etching solution would drain to the second circulation loop 2 for reuse. In such a case, the silica content added through etching of silicon nitride films on the wafers could build up in the system, eventually reaching a level that is too high, where the silica nears the saturation point and begins to cause particle contamination on the wafers. If needed, a portion of the circulating chemical can be drained away and replaced by fresh etching solution from the etching solution supply 42. The operation of this bleed and feed system could be open loop, based on time or number of wafers processed, or closed loop, based on the output of a dissolved silica analyzer.

Some embodiments of the invention provide a method for separating temperature and hydration level control in the first and second circulation loops. The above-described method controls the hydration level (water content) of the heated etching solution and the additional heated etching solution by adding water to maintain temperature at the desired boiling point, thereby tying together the hydration and temperature of the etching solution. This results in overlapping control schemes, one for the heater and one for the water injection.

Still referring to FIG. 1, in order to extend the usable temperature range of the heated etching solution, a Point-of-Use (POU) heater 38 may be added that further increases the temperature of the heated etching solution close to the dispense point where the heated etching solution is introduced into the process chambers 4. However, if the temperature of the heated etching solution is already at the boiling point, there is a limit to how much further the temperature of the heated etching solution can be raised without the heated etching solution boiling in the line and dispensing a two-phase flow to the process chambers.

According to one embodiment of the invention, the second circulation loop 2 may prepare the additional heated etching solution at a high temperature with the hydration level lowered to a desired level. The additional heated etching solution is then fed from the second circulation loop 2 to the first circulation loop 1 that is maintained at a lower temperature. A lower temperature in the first circulation loop 1 gives benefits of increased safety for personnel and improved reliability of equipment. The lower temperature of the first circulation loop 1 allows for larger tubing and less stress on components of the first circulation loop 1. The heated etching solution is then heated by the POU heater 38 to the desired dispense temperature. According to one embodiment, the second circulation loop 2 provides additional heated etching solution to the first circulation loop 1 which operates at a lower temperature than the second circulation loop 2. The second circulation loop 2 may maintain the heated etching solution at a temperature warm enough to ensure efficient flow, but cool enough to allow an increase in the temperature before the POU. In one example, the first circulation loop 1 may operate at about 150° C., and the additional heated etching solution may be provided from the second circulation loop at a hydration level equivalent to boiling at 165° C. Thereafter, the heated etching solution may be returned to the desired dispense temperature (e.g., 165° C.) for dispensing onto the substrates in the process chambers 4. In another example, the first circulation loop 1 may operate at about 150° C., and the additional heated etching solution may be provided from the second circulation loop at a hydration level equivalent to boiling at 170° C. Thereafter, the heated etching solution may be returned to a dispense temperature (e.g., 165° C.) for dispensing onto the substrates in the process chambers 4. In one example, the additional heated etching solution in the second circulation loop 2 may be maintained at a higher temperature and lower hydration level than the heated etching solution in the first circulation loop 1.

According to other embodiments, the first circulation loop 1 may include a hydration monitor 36 for monitoring the hydration level of the heated etching solution. The hydration monitor can, for example, include a refractometer that measures the refractive index of the etching solution, a near-infrared spectrometer, an auto titrator, a conductivity analyzer, or any of a number of similar instruments that are used for chemical concentration monitoring. Further, the hydration monitor 36 may control the DI water supply system 14 to add DI water to the first circulation loop 1.

The processing system 100 further includes a controller 60 to communicate with and control the operation of the first circulation loop 1, the second circulation loop 2, and the process chambers 4. Those skilled in the art will readily realize that the controller 60 may be a general purpose computer containing a microprocessor, a memory, and an input/output port capable of generating control voltages sufficient to communicate with and activate inputs as well as monitor outputs from the first circulation loop 1, the second circulation loop 2, and the process chambers 4. A program stored in the memory may be utilized to activate the inputs according to a stored process recipe. In one example, the controller 60 may be utilized to control the processes described in the processes of the process flow diagram in FIG. 2.

Figure 2:
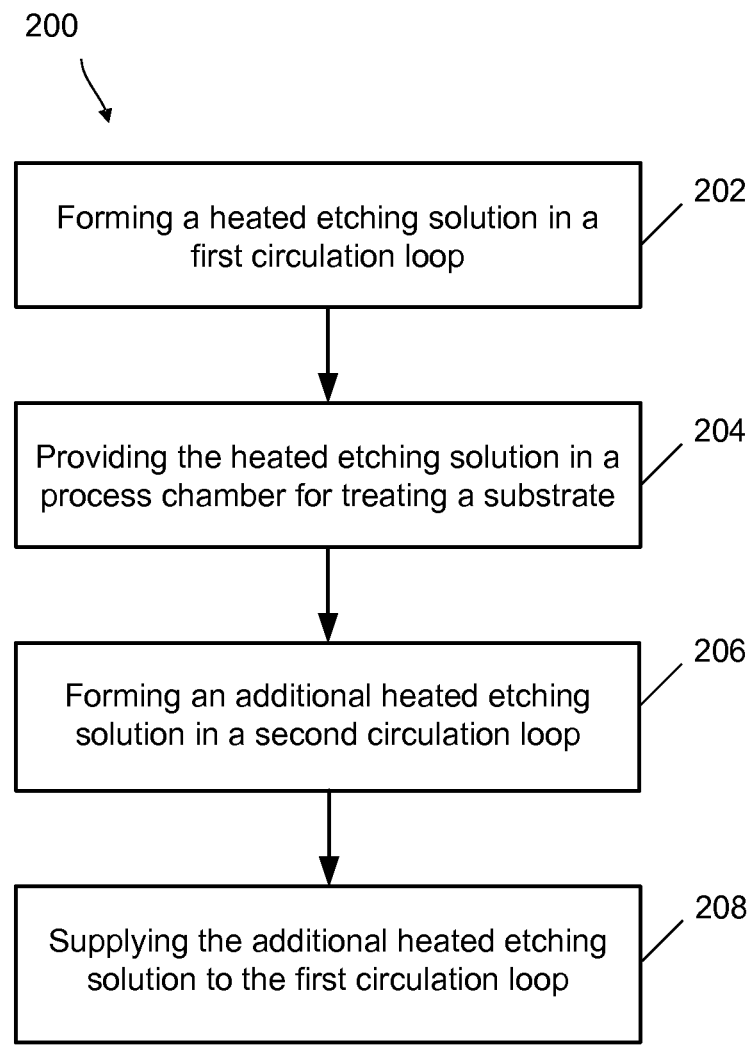
FIG. 2 is a process flow diagram for preparing a heated etching solution and treating a substrate with the heated etching solution according to an embodiment of the invention.

FIG. 2 is a process flow diagram for preparing a heated etching solution and treating a substrate with the heated etching solution according to an embodiment of the invention. The process flow 200 includes, in 202, forming a heated etching solution in a first circulation loop. The heated etching solution is circulated and maintained at a desired temperature in the first circulation loop. According to one embodiment, the heated etching solution can contain or essentially consist of phosphoric acid and water.

In 204, the heated etching solution is provided into a process chamber for treating a substrate. The heated etching solution is flowed from the first circulation loop to the process chamber where the substrate is treated with the heated etching solution. Thereafter, the heated etching solution may be reclaimed and entered into the first or second circulation loops.

In 206, an additional heated etching solution is formed in a second circulation loop. According to one embodiment, forming the additional heated etching solution includes heating the additional heated etching solution to boiling, and boiling off water from the additional heated etching solution until a preselected hydration level is reached. According to another embodiment, forming the additional heated etching solution includes introducing an additional etching solution into the second circulation loop, heating the additional heated etching solution to boiling, boiling off water from the additional heated etching solution until a preselected hydration level is reached, circulating the additional heated etching solution in the second circulation loop. The additional etching solution can include a fresh etching solution, a reclaimed etching solution from the process chamber, or both.

In 208, the additional heated etching solution is supplied to the first circulation loop. The additional heated etching solution has a preselected hydration level that may be selected to closely match the hydration level of the heated etching solution, in order to ensure A plurality of embodiments for improving temperature and hydration level control where refilling of a heated etching solution is required have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of providing a heated etching solution in at least one process chamber, the method comprising:
   providing a first heated etching solution in a first circulation loop, said first heated etching solution circulating in the first circulation loop and comprising aqueous phosphoric acid;
   supplying the heated etching solution in the first circulation loop to the at least one process chamber for treating at least one substrate;
   providing an additional heated etching solution continuously circulating in a second circulation loop, wherein the additionally heated etching solution provides a continuously available supply to refill the first heated etching solution at a processing condition comprising a desired temperature level and a desired hydration level for the first circulation loop;
   adding fresh etching solution to the additional heated etching solution circulating in the second circulation loop, said fresh etching solution comprising aqueous phosphoric acid;
   heating the additional heated etching solution circulating in the second circulation loop to adjust the circulating, additional heated etching solution to a desired temperature level;
   when the desired temperature is reached, continuing to supply heat to the additional heated etching solution circulating in the second circulation loop to maintain the desired temperature;
   while heating the additional heated etching solution, adding water to the additional heated etching solution circulating in the second circulation loop in a manner to maintain a desired hydration level of the additional heated etching solution; and
   supplying the circulating, additional heated etching solution from the second circulation loop to the first circulation loop,
   wherein the step of heating the additional heated etching solution circulating in the second circulation loop comprises:
   heating the additional etching solution to boiling;
   boiling off water from the additional etching solution circulating in the second circulation loop to a preselected, reduced hydration level; and
   wherein the step of continuing to heat the additional heated etching solution circulating in the second circulation loop comprises continuing to boil the additional heated etching solution, and
   wherein the step of adding water to the additional heated etching solution circulating in the second circulation loop comprises adding water to the boiling heated additional etching solution.

2. The method of claim 1, wherein the additional etching solution circulating in the second circulation loop comprises a reclaimed etching solution from the at least one process chamber.

3. The method of claim 1, wherein the heated etching solution and the additional heated etching solutions comprise phosphoric acid, water, and added $SiO_2$.

4. The method of claim 1, further comprising adding $SiO_2$ and/or $GeO_2$ to the heated, additional etching solution circulating in the second circulation loop.

5. The method of claim 4, further comprising analyzing the $SiO_2$ and/or $GeO_2$ of the additional etching solution circulating in the second circulation loop.

6. The method of claim 1, further comprising raising the temperature of the heated etching solution on a pathway between the first circulation loop and the at least one process chamber before dispensing the heated etching solution into the at least one process chamber.

7. The method of claim 1, further comprising monitoring the hydration level of the heated, additional etching solution circulating in the second circulation loop.

8. The method of claim 1, wherein the heated, additional etching solution circulating in the second circulation loop has a lower hydration level than the heated etching solution in the first circulation loop.

9. The method of claim 1, wherein the heated, additional etching solution circulating in the second circulation loop is maintained at a higher temperature than the heated etching solution in the first circulation loop.

10. The method of claim 1, wherein the second circulation loop includes a heated supply tank holding a supply of the circulating, additional heated etching solution, wherein the fresh etching solution and the water are added to the heated supply tank.

11. A method of providing a heated etching solution in at least one process chamber, the method comprising:
    providing a first heated etching solution in a first circulation loop, said first heated etching solution circulating in the first circulation loop and comprising aqueous phosphoric acid;
    supplying the heated etching solution in the first circulation loop to the at least one process chamber for treating at least one substrate;
    providing an additional heated etching solution continuously circulating in a second circulation loop, wherein the additionally heated etching solution provides a continuously available supply to refill the first heated etching solution at a processing condition comprising a desired temperature level and a desired hydration level for the first circulation loop;
    adding fresh etching solution to the additional heated etching solution circulating in the second circulation loop, said fresh etching solution comprising aqueous phosphoric acid;
    heating the additional heated etching solution circulating in the second circulation loop to adjust the circulating, additional heated etching solution to a desired temperature level;
    when the desired temperature is reached, continuing to supply heat to the additional heated etching solution circulating in the second circulation loop to maintain the desired temperature;

while heating the additional heated etching solution, adding water to the additional heated etching solution circulating in the second circulation loop in a manner to maintain a desired hydration level of the additional heated etching solution; and supplying the circulating, additional heated etching solution from the second circulation loop to the first circulation loop, wherein the step of heating the additional etching solution circulating in the second circulation loop comprises introducing an additional amount of aqueous phosphoric acid into the additional etching solution circulating in the second circulation loop;

heating the additional heated etching solution circulating in the second circulation loop to boiling;

boiling off water from the heated, additional etching solution circulating in the second circulation loop to a preselected hydration level and temperature; and circulating the heated, additional etching solution at the pre-selected hydration level and temperature in the second circulation loop.

12. The method of claim 11, wherein the additional etching solution circulating in the second circulation loop comprises a reclaimed etching solution from the at least one process chamber.

13. The method of claim 11, wherein the heated etching solution and the additional heated etching solutions comprise phosphoric acid, water, and added $SiO_2$.

14. The method of claim 11, further comprising adding $SiO_2$ and/or $GeO_2$ to the heated, additional etching solution circulating in the second circulation loop.

15. The method of claim 14, further comprising analyzing the $SiO_2$ and/or $GeO_2$ of the additional etching solution circulating in the second circulation loop.

16. The method of claim 11, further comprising raising the temperature of the heated etching solution on a pathway between the first circulation loop and the at least one process chamber before dispensing the heated etching solution into the at least one process chamber.

17. The method of claim 11, further comprising monitoring the hydration level of the heated, additional etching solution circulating in the second circulation loop.

18. The method of claim 11, wherein the heated, additional etching solution circulating in the second circulation loop has a lower hydration level than the heated etching solution in the first circulation loop.

19. The method of claim 11, wherein the heated, additional etching solution circulating in the second circulation loop is maintained at a higher temperature than the heated etching solution in the first circulation loop.

20. The method of claim 11, wherein the second circulation loop includes a heated supply tank holding a supply of the circulating, additional heated etching solution, wherein the fresh etching solution and the water are added to the heated supply tank.

* * * * *

UNITED STATES PATENT AND TRADEMARK OFFICE
CERTIFICATE OF CORRECTION

PATENT NO. : 9,911,631 B2
APPLICATION NO. : 14/209805
DATED : March 6, 2018
INVENTOR(S) : Kevin L. Siefering and William P. Inhofer Page 1 of 1

It is certified that error appears in the above-identified patent and that said Letters Patent is hereby corrected as shown below:

On the Title Page

Page 2, Column 2, Line 12 (56) References Cited, OTHER PUBLICATIONS, "PCT/US14/26681" should be —PCT/US14/26581—

Signed and Sealed this
Second Day of June, 2020

Andrei Iancu
*Director of the United States Patent and Trademark Office*